United States Patent
Strom

(10) Patent No.: US 9,853,425 B2
(45) Date of Patent: Dec. 26, 2017

(54) BREATHER DRAIN

(71) Applicant: Hubbell Incorporated, Shelton, CT (US)

(72) Inventor: Brent S. Strom, Troy, IL (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 14/849,251

(22) Filed: Sep. 9, 2015

(65) Prior Publication Data

US 2016/0079740 A1 Mar. 17, 2016

Related U.S. Application Data

(60) Provisional application No. 62/049,023, filed on Sep. 11, 2014.

(51) Int. Cl.
| | |
|---|---|
| H05K 5/02 | (2006.01) |
| H02B 1/28 | (2006.01) |
| H02B 1/30 | (2006.01) |
| H02B 1/40 | (2006.01) |
| F16K 24/00 | (2006.01) |

(52) U.S. Cl.
CPC ............ *H02B 1/28* (2013.01); *H02B 1/30* (2013.01); *H02B 1/40* (2013.01); *H05K 5/0213* (2013.01); *F16K 24/00* (2013.01); *Y10T 137/3084* (2015.04)

(58) Field of Classification Search
CPC ...... Y10T 137/3084; H02B 1/28; H02B 1/30; H02B 1/40; H05K 5/0213; F16L 55/07; F16K 24/00; F16K 24/04; F16K 24/06

USPC .......... 220/203.19, 203.01, 601, 373, 367.1, 220/366.1
See application file for complete search history.

(56) References Cited

U.S. PATENT DOCUMENTS

| | | | | | |
|---|---|---|---|---|---|
| 1,156,274 | A | * | 10/1915 | Cormeny | B01D 35/02 137/550 |
| 2,146,311 | A | * | 2/1939 | Pittman | H01F 27/14 174/14 R |

(Continued)

OTHER PUBLICATIONS

Redapt/Cooper Safety Catalog 2012 "Thread Conversion Products" by Redapt/Cooper Safety, see at least p. 26, publically available since Aug. 2012 (the document may be found in at least http://www.lawoolley.com/pdf/redapt_catalog_2012.pdf).*

(Continued)

*Primary Examiner* — Mary McManmon
*Assistant Examiner* — David Colon Morales
(74) *Attorney, Agent, or Firm* — Dickinson Wright PLLC

(57) ABSTRACT

A breather drain includes a main body member having first, second and third portions. The first portion includes a threaded outer surface and a hollow inner cavity with first and second open opposite ends and at least one of the first and second open opposite ends extending from the hollow inner cavity to the threaded outer surface. The second portion includes a flange and having a central passageway therein. The second portion connects with the hollow inner cavity. The third portion includes a protrusion having first and second sides and extending from the second portion. The third portion also includes a transverse hole extending from the first side to the second side and connects with the central passageway.

18 Claims, 5 Drawing Sheets

(56) References Cited

U.S. PATENT DOCUMENTS

| | | | | |
|---|---|---|---|---|
| 2,399,384 A * | 4/1946 | Pross | F24F 13/08 220/288 |
| 2,405,927 A * | 8/1946 | Tornblom | H02G 3/083 138/42 |
| 2,601,216 A * | 6/1952 | White | F24D 19/087 137/197 |
| 2,823,694 A * | 2/1958 | Champion | F16K 17/00 137/197 |
| 2,868,219 A * | 1/1959 | Lucks | F24D 19/087 137/197 |
| 3,356,255 A * | 12/1967 | Zavertnik et al. | F16L 55/00 220/88.2 |
| 3,578,285 A * | 5/1971 | Carlton | F16K 31/50 251/144 |
| 3,696,729 A * | 10/1972 | Chabala | H01H 9/047 174/16.1 |
| 3,732,985 A * | 5/1973 | Murrell | B01D 29/05 210/446 |
| 4,090,093 A * | 5/1978 | Thompson | H01H 37/04 174/58 |
| 4,171,209 A * | 10/1979 | Brown | B01D 46/10 138/41 |
| 4,216,349 A * | 8/1980 | Wium | H02G 3/06 174/23 R |
| 4,298,182 A * | 11/1981 | Balch | F16K 35/02 137/351 |
| 4,387,829 A * | 6/1983 | Berry | H02G 15/26 220/374 |
| 4,470,577 A * | 9/1984 | Warwick | B60T 11/30 188/352 |
| 4,726,392 A * | 2/1988 | Schwarz | H05K 5/0213 137/247.21 |
| 4,893,651 A * | 1/1990 | Herman | B01D 36/006 137/588 |
| 5,094,049 A * | 3/1992 | Sells | E04D 13/17 137/197 |
| 5,368,181 A * | 11/1994 | Myers | F01M 11/0408 141/65 |
| 5,579,815 A * | 12/1996 | Labonte | F01M 11/0408 141/346 |
| 5,661,265 A * | 8/1997 | Yarbrough | H02G 3/088 174/50 |
| 5,796,035 A * | 8/1998 | Walker | H02G 3/0406 138/109 |
| 6,147,298 A * | 11/2000 | Mina | H05K 5/0213 174/17 VA |
| 6,258,269 B1 * | 7/2001 | Knight | B01D 35/16 137/588 |
| 6,318,401 B1 * | 11/2001 | Cheng | B66F 5/04 137/197 |
| 6,609,699 B2 * | 8/2003 | Chen | F01M 11/0408 184/1.5 |
| 6,843,629 B2 * | 1/2005 | Farral | F16B 37/125 411/178 |
| 8,409,675 B2 * | 4/2013 | Ni | H05K 5/0213 428/34.1 |
| 8,420,962 B2 * | 4/2013 | Dodal | H01H 9/04 200/50.02 |
| 2006/0046635 A1 * | 3/2006 | Gonya | H05K 5/0213 454/339 |
| 2006/0113236 A1 * | 6/2006 | Dahlgren | B01D 46/0039 210/237 |
| 2009/0050043 A1 * | 2/2009 | Alvarez | F16K 24/04 114/197 |
| 2010/0154437 A1 * | 6/2010 | Nepsha | F24F 1/02 62/3.4 |
| 2012/0048871 A1 * | 3/2012 | Chiu | H05K 5/0213 220/745 |
| 2012/0168453 A1 * | 7/2012 | Chiu | H05K 5/0213 220/745 |
| 2014/0069711 A1 * | 3/2014 | Barna | H02G 3/088 174/650 |
| 2014/0238495 A1 * | 8/2014 | Matthews | F16K 27/00 137/1 |

OTHER PUBLICATIONS

"Enclosure Accessories—Drains and Breathers" by Crouse-Hinds (Copyright 2013, pp. 857-858).*
Porex Porous PTFE Materials for Medical, Analytical and Industrial Applications, 2010 Porex Corporation, www.porex.com, 2 pages.
Cooper Safety Redapt, Increased Safety Breather Drain IP66 & NEMA 4X, 3 pages.

* cited by examiner

Section A-A

BREATHER DRAIN

RELATED APPLICATIONS

This application claims the benefit under 35 U.S.C. §119 (e) of U.S. Provisional Patent Application Ser. 62/049,023, filed on Sep. 11, 2014, which is hereby incorporated by reference in its entirety.

FIELD OF THE INVENTION

The present invention relates generally to breather drains used to vent moisture from enclosures to the surrounding environment. More specifically, the drains allow moisture and condensation to exit an enclosure, while preventing liquid and particles from entering the enclosure, and allow ambient air to enter the enclosure.

BACKGROUND OF THE INVENTION

In hazardous and other sensitive environments such as refineries, there are multiple overlapping industry safety standards seeking specific levels of compliance and/or certification requirements for heat producing electrical enclosures. Some of these safety standards include fluid ingress and explosion proof requirements. Enclosures in these environments are exposed to various elements such as vapors, gas, hazardous dust, and climate conditions such as rain or snow, as well as the application of high pressure cleaning fluids. Additionally, the enclosures create moisture and condensation cyclically during heating and cooling of the electrical components in the enclosures. These exemplary contaminants can cause failure of the electrical components in the enclosure if the contaminants are not removed.

A need therefore exists for a device that satisfies all relevant safety standards and effectively drains moisture created in the enclosure, while preventing any liquid and particles from entering the enclosure, and allowing ambient air to enter the enclosure.

SUMMARY OF THE INVENTION

The above and other problems are overcome, and additional advantages are realized by illustrative embodiments of the present invention in this application.

An exemplary embodiment of a drain comprises a main body member having first, second and third portions, the first portion having a threaded outer surface and a hollow inner cavity with first and second open opposite ends and at least one of the first and second open opposite ends extending from the hollow inner cavity to the threaded outer surface, the second portion including a flange and a central passageway therein, and connects with the hollow inner cavity, the third portion including a substantially dome-shaped protrusion and having first and second sides that extend from the second portion, the third portion having a transverse hole extending from the first side to the second side and connecting with the central passageway.

BRIEF DESCRIPTION OF THE DRAWINGS

The invention will be more readily understood with reference to the embodiments thereof illustrated in the attached drawing figures, which are incorporated herein and in which.

Throughout the drawing figures, like reference numbers will be understood to refer to like elements, features and structures.

DETAILED DESCRIPTION OF THE INVENTION

Figure 1:
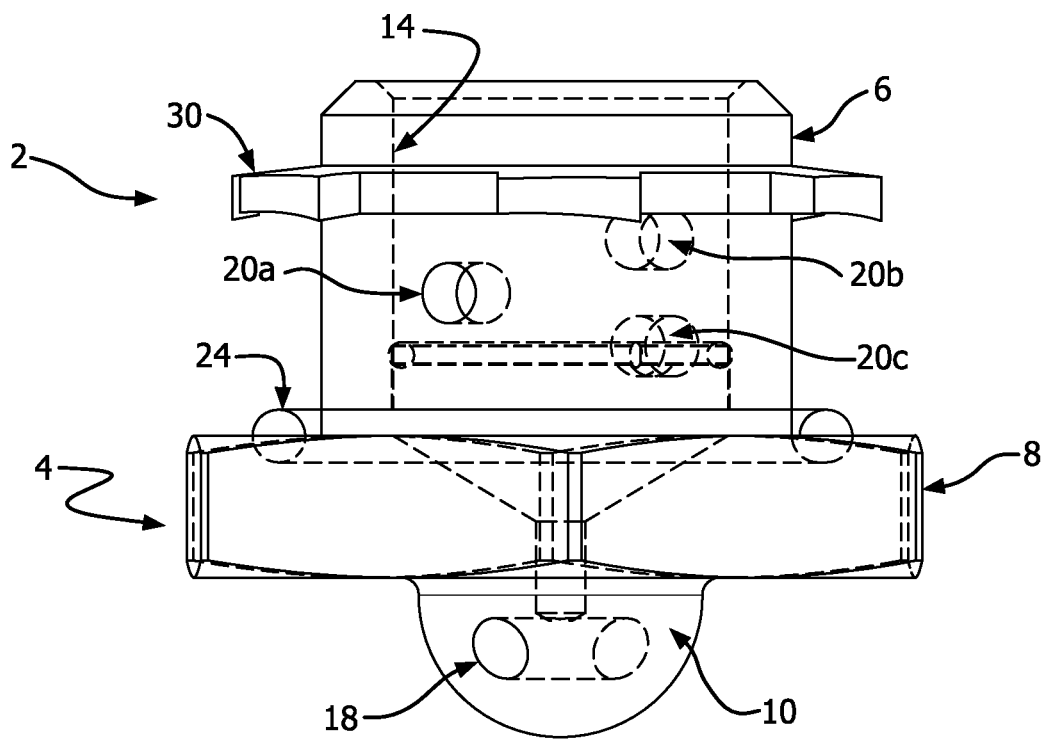
FIG. 1 illustrates an exemplary embodiment of a breather drain in transparent, side elevation.

FIG. 1 illustrates an exemplary embodiment of a breather drain 2 in an assembled state. The breather drain 2 includes a main body member 4 having first portion 6, second portion 8, and third portion 10. The first portion 6 includes a threaded outer surface. The threaded outer surface is not illustrated in FIG. 1 to simplify the drawing. The assembled state includes an elastic member 24 that engages a surface of an enclosure. The main body member 4 can optionally include a cavity for the elastic member 24 to be disposed. The elastic member 24 creates a sealing interface between the breather drain 2 and the enclosure 22 shown in FIGS. 9-11 to minimize fluid from the environment entering the enclosure 22. The assembled state also includes a locknut 30 that secures the main body member 4 of the breather drain 2 to the enclosure 22.

Figure 2:
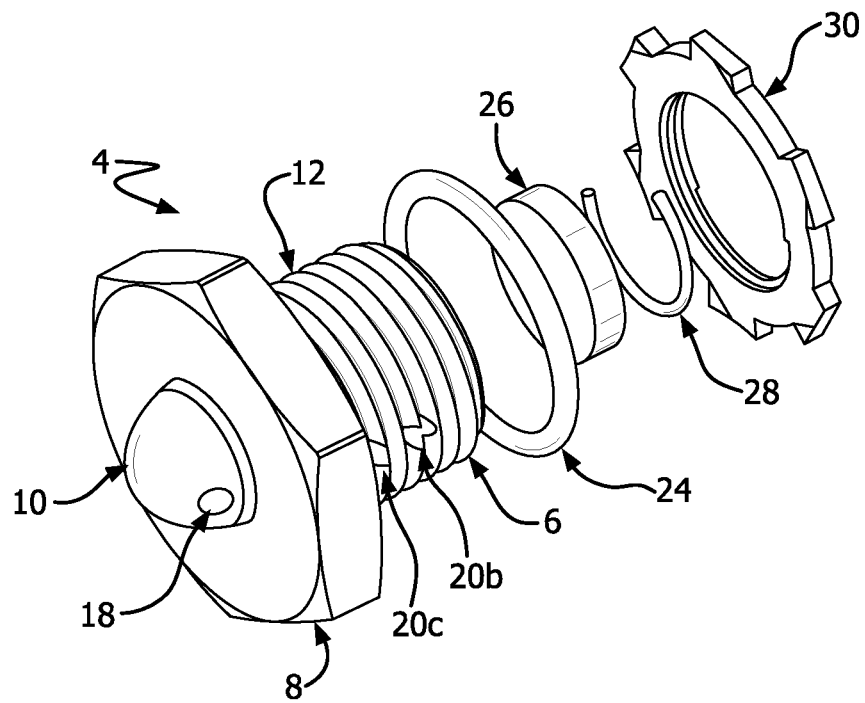
FIG. 2 illustrates an exemplary embodiment of a exploded assembly view of the breather drain of FIG. 1 in right perspective.

FIG. 2 illustrates an exemplary embodiment of an exploded assembly view of the breather drain 2. In addition to the features illustrated in FIG. 1, the breather drain 2 also includes a dust seal 26 that protects the enclosure 22 from liquid, dust or other particles. Finally, a seal retainer 28 engages the first portion 6 to secure the position of the dust seal 26.

Figure 3:
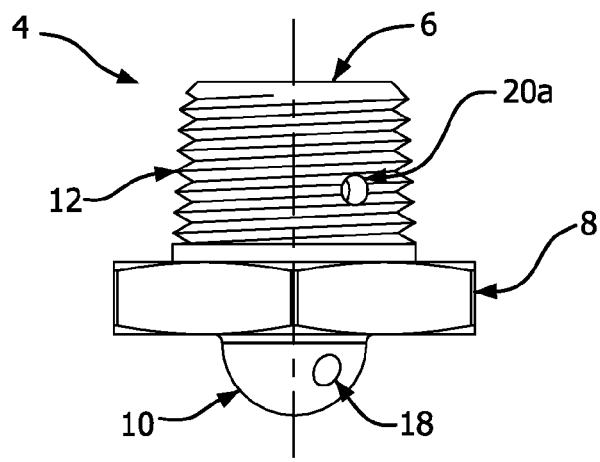
FIG. 3 illustrates an exemplary embodiment of a main body member of the drain of FIG. 1 in side elevation.

FIG. 3 illustrates an exemplary embodiment of a side view of the main body member 4. As discussed above, the first portion 6 includes a threaded outer surface 12 which threadedly engages the threaded interior of locknut 30 to secure the breather drain 2 to the enclosure 22. The threaded outer surface 12 includes at least one outlet hole 20 extending therethrough to provide a drain path for any undesired liquid or debris from the inside to the outside of first portion 6.

Figure 4:
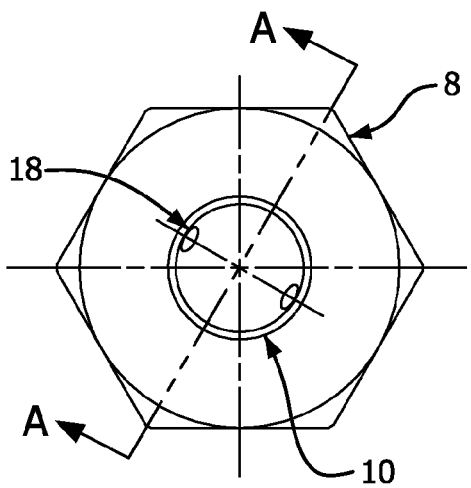
FIG. 4 illustrates an exemplary embodiment of the main body member of the drain of FIG. 1 in top plan.

FIG. 4 illustrates an exemplary embodiment of a top plan view of the main body member 4 depicting the second portion 8. Specifically, the second portion 8 is a flange illustrated as a low profile hexagon. However, a variety of configurations are contemplated for the shape of the flange of the second portion 8. For example, the second portion 8 can also be circular, a flange having two flat surfaces or a flange having any polygonal outer shape. It is preferable that the flange includes at least two flat surfaces to aid in assembly and operation.

Figure 5:
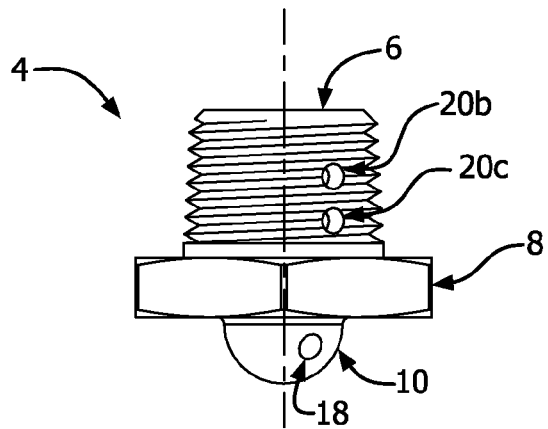
FIG. 5 illustrates an exemplary embodiment of the main body member of the drain shown in FIG. 3 in side elevation rotated through 180 degrees about the vertical central axis.

FIG. 5 illustrates an exemplary embodiment of an alternate, rotated side view of the main body member 4. The second portion 8 is connected to the third portion 10. The third portion 10 includes a protrusion that is substantially dome-shaped. The third portion 10 has at least two curved, convex side surfaces substantially opposite from each other. A transverse hole 18 extends completely through the protrusion and exit at the two side surfaces that are opposite from each other.

The first portion 6 also includes two more outlet holes 20b and 20c that extend therethrough and are disposed at two separate positions along the thread length. As discussed above, one of the outlet holes 20a is disposed on a first side of the first portion 6, while the other two outlet holes 20b and 20c are disposed on a second side of the first portion 6. The first side and the second side of the first portion 6 are substantially opposite from each other.

Figure 6:
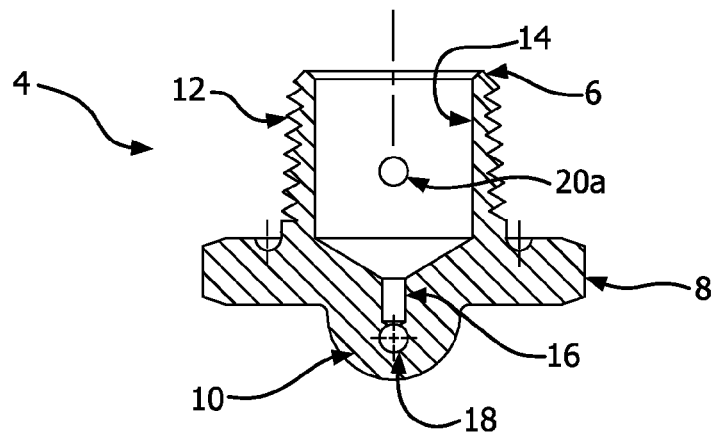
FIG. 6 illustrates an exemplary embodiment of the main body member of the drain shown in FIG. 5 in side elevation taken along the line A-A of FIG. 4.

FIG. 6 illustrates an exemplary embodiment of a cross-sectional view of the main body member 4 taken along the line A-A of FIG. 4. The first portion 6 has a hollow inner cavity 14 with first and second open opposite ends. At least one of the first and second open opposite ends extends from the hollow inner cavity 14 to the threaded outer surface 12. The hollow inner cavity 14 of the first portion 6 is substantially smooth and cylindrical.

The other of the open opposite end of the hollow inner cavity 14 connects to a central passageway 16 in the second portion 8. Although a variety of shapes can be implemented, the central passageway 16 preferably includes a substantially frustoconical portion and a cylindrical portion. The central passageway 14 intersects with the transverse hole 18 of the third portion 10 and is substantially perpendicular thereto.

Figure 7:
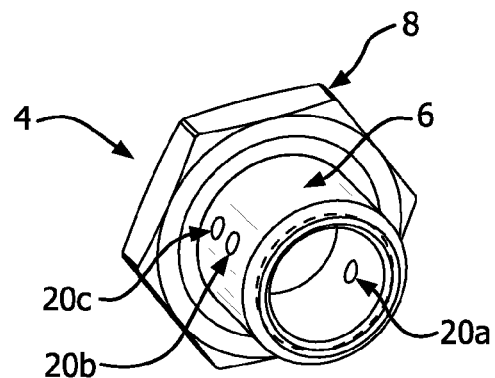
FIG. 7 illustrates an exemplary embodiment of the main body member of FIG. 1 is a left perspective view.
Figure 8:
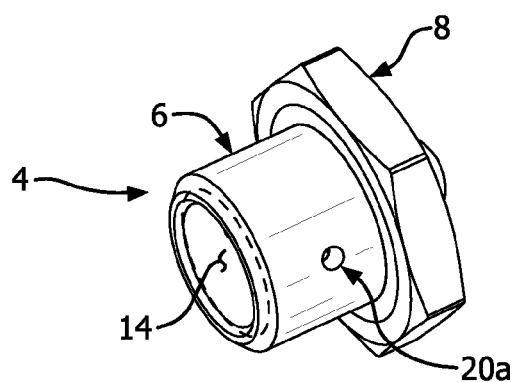
FIG. 8 illustrates an exemplary embodiment of the main body member of FIG. 1 in a right perspective view.

FIGS. 7 and 8 illustrate an exemplary embodiment in perspective views of the main body member 4. As discussed above and illustrated herein, the two sets of outlet holes 20a-c are substantially opposite from each other. Specifically, two outlet holes 20b and 20c are disposed on one side of the first portion 6 and another outlet hole 20a is disposed on another side of the first portion 6.

The main body member 4 including the first portion 6, second portion 8, and third portion 10 are advantageously integrally formed as a one-piece, unitary structure. Preferably, the main body member 4 is formed from a metal such as stainless steel, aluminum, or brass. However, the main body member 4 can also be formed from a plastic such as nylon, and the various portions can be separately formed and coupled together via mechanical couplings, adhesive or welding.

Figure 9:
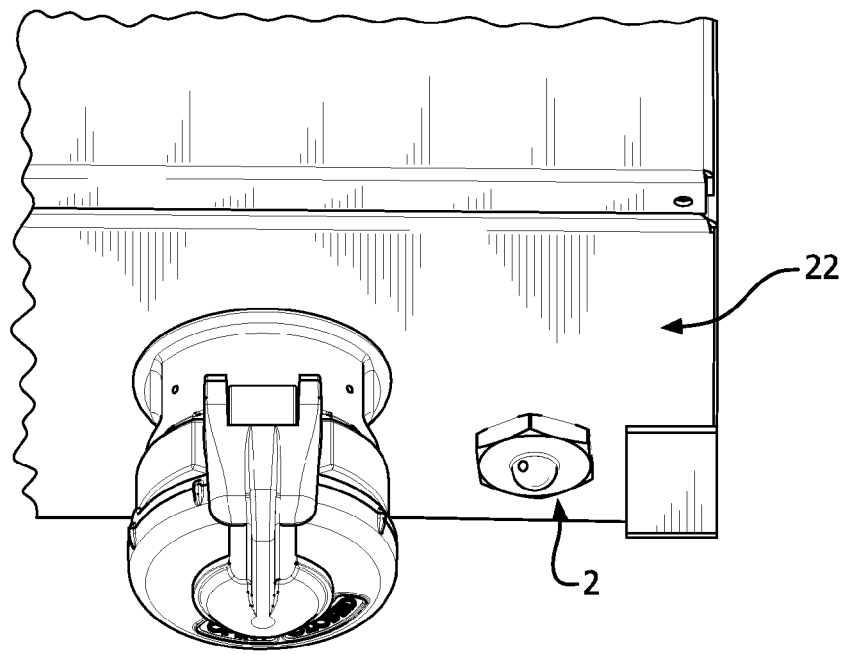
FIG. 9 illustrates an exemplary embodiment of the breather drain of FIG. 1 mounted on an enclosure in a partial, bottom perspective view.
Figure 10:
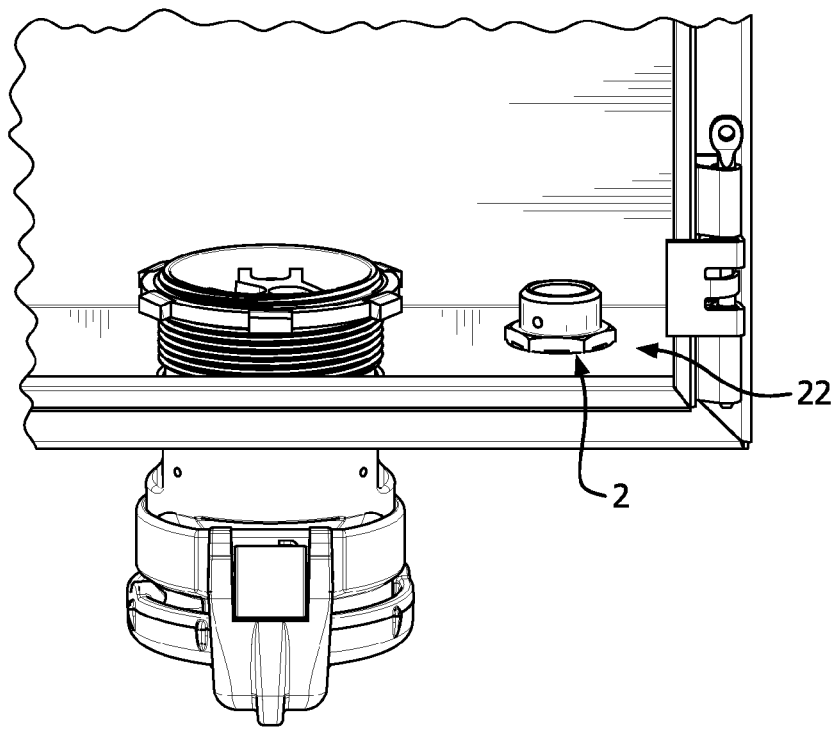
FIG. 10 illustrates an exemplary embodiment of the breather drain mounted on the enclosure shown in FIG. 9 in a partial, side elevation view with parts broken away for clarity.
Figure 11:
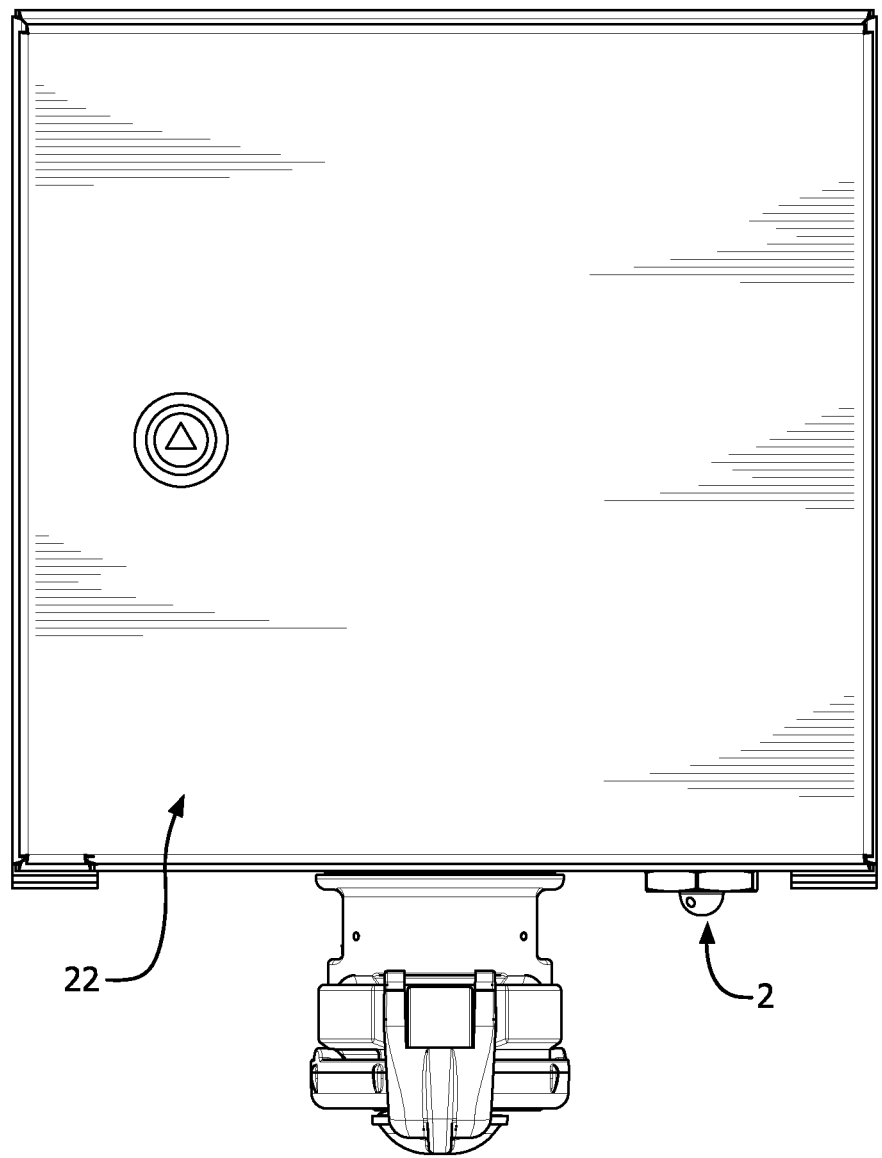
FIG. 11 illustrates an exemplary embodiment of the breather drain of FIG. 1 mounted on the enclosure shown in FIGS. 9 and 10 in a side elevation view.

FIGS. 9-11 illustrate an exemplary embodiment of the breather drain 2 mounted on the enclosure 22. The enclosure 22 is preferably a sheet metal box. Exemplary embodiments of the enclosure 22 include a power electronics box, a circuit breaker box, and a metering equipment box.

FIG. 9 shows that the breather drain 2 is preferably attached to a bottom surface or a wall of the enclosure 22. Specifically, the third portion 10 of the breather drain 2 is disposed downward with respect to the main body member 4 and the enclosure 22. FIG. 10 depicts the breather drain 2 in the assembled state and engaging the wall of the enclosure 22. In particular, the wall of the enclosure 22 is sandwiched between the locknut 30 and the flange of the second portion 8 to secure the breather drain 2 to the enclosure 22. FIG. 11 depicts a side view of the breather drain 2 mounted on the enclosure 22.

During operation, the breather drain 2 is preferably mounted on an enclosure 22 containing heat producing electrical equipment. When the electrical components in the enclosure 22 are shut down, the temperature of the enclosure 22 naturally decreases due to the air temperature of the surrounding environment. As a result, the heat exchanged between the enclosure 22 and the environment draws moisture into the enclosure 22, thus forming condensation.

Under this condition, the breather drain 2 advantageously allows a natural exchange of air between the environment and the enclosure 22. Specifically, the central passageway 16 and the transverse hole 18 provide a drain path for the environmental exchange to take place. The breather drain 2 also advantageously prevents the accumulation of liquid arising from the moisture and the condensation formed in the enclosure 22 by allowing the liquid to exit via the drain path. The removal of any liquid in the enclosure 22 minimizes electrical component failure.

Depending on the thickness of the wall of the enclosure 22, the outlet holes 20a-c are disposed at multiple positions along the length of the threaded outer surface 12 to advantageously provide multiple drain paths and minimize the accumulation of liquid. Specifically, the liquid enters one of the outlet holes 20a-c and travels into the hollow inner cavity 14 of the first portion 6. Subsequently, the liquid exits the enclosure 22 by traveling through the drain path. The use of outlet holes 20a-c avoids the liquid from draining only when the liquid level reaches the top of the breather drain 2. That is, the outlet holes 20a-c provide a liquid path that allows the liquid to drain sooner.

In another operational condition, hazardous chemicals can build up on the outer surface of the enclosure 22. An operator may desire to use a high pressure fire hose to wash the enclosure 22 and remove the hazardous chemicals. Under this condition, the breather drain 2 advantageously continues to communicate with the environment and perform the draining functions discussed above, as well as preventing liquid, such as high pressure water, from entering the enclosure 22.

Specifically, the breather drain 2 is advantageously disposed downwardly. Thus, the downward force of gravity minimizes liquid from entering the breather drain 2 and traveling into the enclosure 22.

Moreover, the third portion 10 is substantially dome-shaped. This contour advantageously provides a smooth, round, aerodynamic surface having a reduced profile surface area and a relatively small overall height. The combination of these features deflects fluid that contacts the third portion 10 and prevents the liquid from traveling through the drain path.

Additionally, the central passageway 16 intersects the transverse hole 18 and is substantially perpendicular thereto. This configuration creates approximately a 90° drain path. Accordingly, the drain path arrangement minimizes liquid from traveling through the drain path and entering the enclosure 22.

Finally, as illustrated in FIG. 2, a dust seal 26 is disposed in the main body member 4. The dust seal 26 can prevent hazardous dust, particles, as well as liquid from entering the enclosure 22. The combination of each of these features allows the breather drain 2 to continue to drain moisture from the enclosure 22, while protecting the enclosure 22 from receiving any liquid from the environment.

Although only a few embodiments of the present invention have been shown and described, the present invention is not limited to the described embodiments. Instead, it will be appreciated by those skilled in the art that changes may be made to these embodiments without departing from the principles and spirit of the invention. It is particularly noted that those skilled in the art can readily combine the various technical aspects of the various elements of the various exemplary embodiments that have been described above in numerous other ways, all of which are considered to be within the scope of the invention, which is defined by the appended claims and their equivalents.

What is claimed is:

1. A drain for draining fluid and providing an exchange of air flow, the drain comprising:
    a main body member having first, second and third portions;
    the first portion having a threaded outer surface and a hollow inner cavity with first and second open opposite ends and at least one of the first and second open opposite ends extending from the hollow inner cavity to the threaded outer surface;
    the second portion having a flange and having a central passageway therein, the second portion connecting with the hollow inner cavity; and
    the third portion including a substantially spherically dome-shaped protrusion having first and second sides and extending from the second portion, the third portion having a transverse hole extending from the first side to the second side and connects with the central passageway, the transverse hole configured to draining fluid and providing air flow to and from the drain.

2. The drain according to claim 1, wherein
    the threaded outer surface of the first portion includes at least one outlet hole extending therethrough.

3. The drain according to claim 1, wherein
    the first portion includes at least three outlet holes that extend therethrough, and
    one of the outlet holes is disposed on one side of the first portion and two of the outlet holes are disposed on another side of the first portion substantially opposite the one outlet hole.

4. The drain according to claim 1, wherein the flange is a low profile hexagon.

5. The drain according to claim 1, wherein the flange is circular.

6. The drain according to claim 1, wherein the flange includes two flat surfaces.

7. The drain according to claim 1, wherein the flange has a polygonal outer surface.

8. The drain according to claim 1, wherein the main body member is formed from a metal.

9. The drain according to claim 1, wherein the first, second, and third portions are integrally formed as a unitary structure.

10. The drain according to claim 1, wherein the hollow inner cavity of the first portion is substantially smooth and cylindrical.

11. The drain according to claim 1, wherein the central passageway includes a substantially frustoconical portion and a cylindrical portion.

12. The drain according to claim 1, wherein the central passageway intersects the transverse hole and is substantially perpendicular thereto.

13. The drain according to claim 1, wherein the main body member is attached to a wall or an enclosure.

14. The drain according to claim 13, further comprising a locknut that secures the main body member to the enclosure.

15. The drain according to claim 1, wherein the main body member has a cavity that engages an elastic member.

16. The drain according to claim 1, further comprising
    a dust seal coupled to the first portion, and
    a seal retainer engaging the inner cavity of the first portion to secure the dust seal.

17. A drain for draining fluid and providing an exchange of air flow, the drain comprising:
    a main body member having first, second and third portions;
    the first portion having a threaded outer surface and a hollow inner cavity with first and second open opposite ends and at least one of the first and second open opposite ends extending from the hollow inner cavity to the threaded outer surface;
    the second portion having a flange and having a central passageway therein, the second portion connecting with the hollow inner cavity; and
    the third portion including a substantially spherically dome-shaped protrusion having first and second sides and extending from the second portion, the third portion having a transverse hole extending from the first side to the second side and connects with the central passageway, the transverse hole configured to draining fluid and providing air flow to and from the drain;
    wherein the main body member is monolithic.

18. A drain for draining fluid and providing an exchange of air flow, the drain comprising:
    a main body member having first, second and third portions;
    the first portion having a threaded outer surface and a hollow inner cavity with first and second open opposite ends and at least one of the first and second open opposite ends extending from the hollow inner cavity to the threaded outer surface;
    the second portion having a flange and having a central passageway therein, the second portion connecting with the hollow inner cavity; and
    the third portion including a substantially spherically dome-shaped protrusion being semi-circular in shape and having first and second sides and extending from the second portion, the third portion having a transverse hole extending from the first side to the second side and connects with the central passageway, the transverse hole configured to draining fluid and providing air flow to and from the drain.

* * * * *